US005760963A

United States Patent [19]
Mori

[11] Patent Number: 5,760,963
[45] Date of Patent: Jun. 2, 1998

[54] FLY-EYE LENS, ILLUMINATION OPTICAL APPARATUS, AND EXPOSURE APPARATUS

[75] Inventor: Takashi Mori, Kawasaki, Japan

[73] Assignee: Nikon Corporation, Tokyo, Japan

[21] Appl. No.: 619,252

[22] Filed: Mar. 21, 1996

[30] Foreign Application Priority Data

Mar. 22, 1995 [JP] Japan .................. 7-062429

[51] Int. Cl.$^6$ ........................................ G02B 27/10
[52] U.S. Cl. ..................... 359/622; 359/623; 359/626
[58] Field of Search ....................... 359/621, 622, 359/623, 626, 619

[56] References Cited

U.S. PATENT DOCUMENTS

| | | |
|---|---|---|
| 1,762,932 | 6/1930 | Mihalyi . |
| 2,186,123 | 1/1940 | Rantsch et al. . |
| 2,326,970 | 8/1943 | Rantsch . |
| 3,267,802 | 8/1966 | Noble . |
| 3,296,923 | 1/1967 | Miles . |
| 3,941,475 | 3/1976 | Sheets . |
| 4,497,015 | 1/1985 | Konno et al. . |
| 4,851,882 | 7/1989 | Takahashi et al. . |
| 4,988,188 | 1/1991 | Ohta . |
| 5,098,184 | 3/1992 | van den Brandt et al. . |
| 5,237,367 | 8/1993 | Kudo . |
| 5,245,384 | 9/1993 | Mori . |

FOREIGN PATENT DOCUMENTS 56-81813   7/1981   Japan .
741246    11/1955   United Kingdom .

OTHER PUBLICATIONS

Koji Mori "Stepper Illumination Optical System" Hikari Araiansu, vol. 5, No. 3 1994.

Francis Jenkins & Harvey White; Fundamentals of Optics Fourth Edition; pp. 163–165; 1981.

*Primary Examiner*—Frank G. Font
*Assistant Examiner*—Evelyn A. Lester
*Attorney, Agent, or Firm*—Foley & Lardner

[57] ABSTRACT

A fly-eye lens in accordance with the present invention comprises a plurality of lens elements which are arranged in two-dimensionally close contact with each other so as to connect light-entering and light-exit surfaces of the lens elements to each other, while at least three refractive surfaces with a predetermined refractive power are disposed between the light-entering and light-exit surfaces in each of the lens elements. Here, each of the plurality of lens elements has an identical focal length f and, concering a bundle of rays which enters each of the lens elements in parallel to its optical axis with a maximum incident height $h_{max}$ and then is emitted therefrom with an exit angle $\theta_{max}$, substantially satisfies a conditional expression:

$$h_{max} = f \sin \theta_{max}$$

Accordingly, the plurality of lens elements substantially satisfy a sine condition, whereby the fly-eye lens forms a perfect diffusing surface light source.

24 Claims, 8 Drawing Sheets

FLY-EYE LENS, ILLUMINATION OPTICAL APPARATUS, AND EXPOSURE APPARATUS

BACKGROUND OF THE INVENTION

1. Field of the Invention

The present invention relates to a fly-eye lens which forms a uniform illuminance distribution with respect to an illumination area, an illumination optical system provided with this fly-eye lens, and an exposure apparatus in which this illumination optical apparatus is loaded. More specifically, the present invention relates to a fly-eye lens which is suitably applied to an illumination optical system for illuminating a reticle, in which a transfer pattern is formed, for making, for example, semiconductor devices or liquid crystal display devices, to an illumination optical apparatus equipped with this fly-eye lens, and to an exposure apparatus in which this illumination optical apparatus is loaded.

2. Related Background Art

In cases where semiconductor devices or liquid crystal display devices, for example, are manufactured by a photolithography step, it has been known to use a projection type exposure apparatus in which a transfer pattern formed in a reticle, as a mask, is transferred to a photosensitive substrate by way of a projection optical system under predetermined illumination light, a proximity type exposure apparatus in which a transfer pattern of a reticle is directly transferred to a photosensitive substrate disposed in close proximity to the reticle under predetermined illumination light, or the like. In such a projection type exposure apparatus and a proximity type exposure apparatus, since fluctuation of exposure on the photosensitive substrate has to be minimized, there has been used an illumination optical system in which an optical integrator is used so as to illuminate a predetermined illumination area on the reticle with an irradiance distribution which is as uniform as possible.

A fly-eye lens conventionally used as an optical integrator in such an exposure apparatus comprises a bundle of numerous lens elements which are two-dimensionally in contact with each other. Since two refractive surfaces opposite to each other in each lens element are disposed at the focal points of their corresponding refractive surfaces, these two refractive surfaces function as field lenses for their corresponding refractive surfaces.

The prior art concerning an illumination optical system using such a fly-eye lens is disclosed in detail in Japanese Patent Laid-Open No. 56-81813, for example.

In the exposure apparatus for semiconductors, in order to respond to the recent improvement in integration of semiconductor devices or the like, there has been a demand for a very high image uniformity on the whole surface of the exposure field in its projection optical system. Accordingly, in the illumination optical system, a high level of uniformity is required for (1) irradiance and (2) numerical aperture with respect to the position within the illumination area.

SUMMARY OF THE INVENTION

An object of the present invention is to provide a fly-eye lens which can improve uniformity of both irradiance and numerical aperture at the illumination area.

Another object of the present invention is to provide an illumination optical apparatus provided with such a fly-eye lens.

A further object of the present invention is to provide an exposure apparatus in which such an illumination optical apparatus is loaded.

Intrinsically, the necessary and sufficient conditions to simultaneously satisfy the uniformity of irradiance and uniformity of numerical aperture within an illumination area in an illumination optical system using a fly-eye lens are two conditions as follows:

(a) a perfect diffusing surface light source (so-called Lambert surface) is formed within an aperture stop of the illumination optical system and (b) assuming that a condenser lens has a focal length F and illumination light is incident on the condenser lens with an incident angle $\theta$, image height y in the illumination area has a projective relationship indicated by expression (1):

$$y = F \cdot \sin \theta \tag{1}$$

Here, in the following, it will be proved that, when a fly-eye lens satisfies a so-called sine condition, a light source image formed on the exit-side surface of the fly-eye lens can be approximately regarded as a perfect diffusing surface light source of condition (a).

Namely, in cases where a bundle of rays entering the respective lens elements, which constitute fly-eye lens, are in parallel to each other along the optical axis of the illumination optical system and uniformly distributed, assuming that the incident height of a light beam with respect each lens element is h, the focal length of each lens element is f, and the exit angle of the light beam exited from each lens element with respect to the optical axis of the illumination optical system is $\theta$, by using a predetermined function $g(\theta)$ concering the exit angle $\theta$, it is supposed that the relationship indicated by expression (2) is established:

$$h = f \cdot g(\theta) \tag{2}$$

Here, it is assumed that the irradiance at the inlet-side surface of the fly-eye lens is A, the radiant intensity concerning the exit angle $\theta$ of a point light source generated by each lens element at the exit-side surface of the fly-eye lens is $I(\theta)$, and the radiance luminance concerning the exit angle $\theta$ of a surface light source generated by the whole lens elements is $L(\theta)$.

Then, based on the law of energy conservation, expression (3) is obtained:

$$A \cdot 2\pi \cdot h \cdot dh = I(\theta) 2\pi \cdot \sin \theta \cdot d\theta \tag{3}$$

Also, when expression (2) is differentiated, expression (4) is obtained:

$$dh/d\theta = f \cdot g'(\theta) \tag{4}$$

wherein function $g'(\theta)$ is a differential of the function $g(\theta)$ with respect to $\theta$.

From these expressions (3) and (4), expression (5) is obtained:

$$I(\theta) = A \cdot f^2 \cdot g(\theta) g'(\theta) / \sin \theta \tag{5}$$

Here, since $I(0) = Af^2$, expression (5) becomes expression (6):

$$I(\theta) = I(0) g(\theta) g'(\theta) / \sin \theta \tag{6}$$

Assuming that the assembly of the point light sources indicated by expression (6), as a whole, is a surface light source, expression (7) is obtained:

$$L(\theta) = L(0) g(\theta) g'(\theta) / (\sin \theta \cdot \cos \theta) \tag{7}$$

Also, assuming that a condenser lens converging the light exited from the fly-eye lens has a focal length F, a light beam is incident on the condenser lens with an incident angle θ with respect to the optical axis of the illumination optical system, and the light beam exited from the condenser lens has an image height y, by using a predetermined function G(θ) concering the incident angle θ, it is supposed that the projective relationship indicated by expression (8) is established:

$$y = F \cdot G(\theta) \quad (8)$$

Here, it is assumed that the diameter of a circular surface light source with respect to the condenser lens is D and the radiant intensity concerning the image height y at the surface to be irradiated with respect to the condenser lens is E(y).

Then, based on the law of energy conservation, expression (9) is obtained:

$$L(\theta)\pi(D/2)^2 \cos\theta \cdot 2\pi \sin\theta \cdot d\theta = E(y) \cdot 2\pi \cdot y \cdot dy \quad (9)$$

Also, when expression (8) is differentiated, expression (10) is obtained:

$$dy/d\theta = F \cdot G'(\theta) \quad (10)$$

wherein function G'(θ) is a differential of the function G(θ) with respect to θ.

From these (9) and (10), expression (11) is obtained:

$$E(y) = L(\theta)\pi(D/2)^2 \cos\theta \cdot \sin\theta / \{F^2 \cdot G(\theta)G'(\theta)\} \quad (11)$$

Here, since $E(0) = \pi(D/2)^2 L(0)/F^2$, expression (11) becomes expression (12):

$$E(y) = E(0)\{L(\theta)/L(0)\}\cos\theta \cdot \sin\theta / \{G(\theta)G'(\theta)\} \quad (12)$$

Accordingly, from expressions (7) and (12), expression (13) is obtained:

$$E(y) = E(0)g(\theta)g'(\theta)/\{G(\theta)G'(\theta)\} \quad (13)$$

Here, assuming that the inlet-side surface of the fly-eye lens is projected, without distortion aberration, onto the surface to be irradiated with respect to the condenser lens, expression (14) is obtained:

$$g(\theta) = G(\theta) \quad (14)$$

From these expressions (13) and (14), expression (15) is obtained, whereby a uniform irradiance can be realized:

$$E(y) = E(0) \quad (15)$$

Here, the condition to satisfy expression (14) is the same as the condition under which y/h=F/f is established from expressions (2) and (8).

Further, it is assumed that numerical aperture concerning the image height y at the surface to be irradiated with respect to the condenser lens is NA(y).

When a condition of aplanatism is established outside of the optical axis of the condenser lens, expression (16) is obtained:

$$dy \cdot NA(y) = (D/2)\cos\theta \cdot d\theta \quad (16)$$

From expressions (10) and (16), expression (17) is obtained:

$$NA(y) = (D/2)\cos\theta / \{F \cdot G'(\theta)\} \quad (17)$$

Here, since NA(0)=D/2F, expression (18) is obtained.

$$NA(y) = NA(0)\cos\theta / G'(\theta) \quad (18)$$

When the above-mentioned condition of expression (14) for attaining a uniform irradiance is input into expression (18), expression (19) is obtained:

$$NA(y) = NA(0)\cos\theta / g'(\theta) \quad (19)$$

Here, when the sine condition of the fly-eye lens is established, expression (20) is obtained:

$$g(\theta) = \sin\theta \quad (20)$$

From these expressions (19) and (20), expression (21) is obtained, whereby a uniform numerical aperture can be realized:

$$NA(y) = NA(0) \quad (21)$$

Accordingly, it can be seen that irradiance and numerical aperture become uniform with respect to the position at the surface to be irradiated only when the fly-eye lens satisfies the sine condition indicated by expression (22):

$$h = f \sin\theta \quad (22)$$

Here, offense against the sine condition OSC of the fly-eye lens is defined as indicated by expression (23):

$$OSC = h/\sin\theta - f \quad (23)$$

From expression (23), the image height h is indicated by expression (24):

$$h = f(1 + OSC/f)\sin\theta \quad (24)$$

Accordingly, from expression (2), the function g(θ) is indicated by expression (25):

$$g(\theta) = (1 + OSC/f)\sin\theta \quad (25)$$

Then, the offense against the sine condition OSC is newly converted to function DS(θ) as indicated by expression (26):

$$DS(\theta) = OSC/f \quad (26)$$

Further, assuming that a condenser lens having a relationship of G(θ)=g(θ) is used in order to attain a uniform irradiance, from expressions (25) and (26), the relationship indicated by expression (27) is established:

$$G(\theta) = (1 + DS(\theta))\sin\theta \quad (27)$$

When expression (27) is differentiated with respect to θ, the differential of the function G(θ) is indicated by expression (28):

$$G'(\theta) = \sin\theta\{d(DS)/d\theta\} + (1 + DS)\cos\theta \quad (28)$$

Also, within the range of tertiary aberration, by using a constant K, the function DS(θ) can be indicated by expression (29):

$$DS(\theta) = K \cdot \sin^2\theta \quad (29)$$

When this expression (29) is differentiated with respect to θ, the differential of the function DS(θ) is indicated by expression (30):

$$d(DS)/d\theta = 2K \cdot \sin\theta \cdot \cos\theta \quad (30)$$

When expression (30) is input, expression (28) becomes expression (31):

$$G'(\theta)=2K\cdot\sin^2\theta\,\cos\,\theta+(1+DS(\theta))\cdot\cos\,\theta=\cos\,\theta(1+3\cdot DS(\theta)) \quad (31)$$

Accordingly, when expression (31) is input, expression (18) becomes expression (32):

$$NA(y)=NA(0)/(1+3\cdot DS(\theta)) \quad (32)$$

This expression (32) means that the numerical aperture in the illumination optical system at the image height y is determined according to the function $DS(\theta)$ which is defined by expression (26) in reference to the offense against the sine condition OSC concerning the incident angle $\theta$ with respect to the condenser lens. Accordingly, in cases where a condenser lens by which irradiance becomes uniform in response to the offense against the sine condition OSC of the fly-eye lens is used, for example, when the offense against the sine condition OSC of the fly-eye lens is 1% of the focal length, the illumination numerical aperture NA(y) may change by 3% at its corresponding image height. From the standpoint of image formation, the numerical aperture within the illumination area is preferably prevented from fluctuating by more than 3%.

The fly-eye lens in accordance with the present invention comprises a plurality of lens elements which are arranged in two-dimensionally close contact with each other so as to connect light-entering and light-exit surfaces of the lens elements to each other, while at least three refractive surfaces with a predetermined refractive power (other than zero) are disposed between the light-entering and light-exit surfaces in each of the lens elements. Here, each of the plurality of lens elements has an identical focal length f and, concerning a bundle of rays which enters each of the lens elements in parallel to its optical axis with a maximum incident height $h_{max}$ and then is emitted therefrom with an exit angle $\theta_{max}$ substantially satisfies expression (33):

$$h_{max}=f\cdot\sin\,\theta_{max} \quad (33)$$

Also, the illumination optical apparatus in accordance with the present invention comprises (a) a light source for generating illumination light; (b) a rays-bundle shaping optical system for shaping a bundle of rays flux of the illumination light emitted from the light source; (c) a fly-eye lens composed of a plurality of lens elements which are arranged in two-dimensionally close contact with each other so as to connect light-entering and light-exit surfaces of the lens elements to each other, while at least three refractive surfaces with a predetermined refractive power are disposed between the light-entering and light-exit surfaces in each of the lens elements, whereby the illumination light emitted from the rays-bundle shaping optical system is converged by the plurality of lens elements so as to form a surface light source; and (d) a condenser optical system which superposes the illumination light diverging from the surface light source formed by the fly-eye lens and makes it irradiate a surface to be irradiated. Here, each of the plurality of lens elements has an identical focal length f and, concerning the illumination light which enters each of the lens elements in parallel to its optical axis with a maximum incident height $h_{max}$ and then is emitted therefrom with an exit angle $\theta_{max}$ substantially satisfies the above-mentioned expression (33).

Further, the exposure apparatus in accordance with the present invention comprises (1) a reticle stage holding a reticle within which a projection exposure pattern is formed; (2) a wafer stage holding a wafer whose surface is coated with a photosensitive resist; (3) an illumination optical apparatus for irradiating the pattern of the reticle with illumination light; and (4) a projection optical apparatus for forming an image of the illumination light as exposure light, which has been subjected to interference according to the pattern of the reticle, upon the wafer. Here, the illumination optical apparatus comprises (a) a light source for generating the illumination light; (b) a rays-bundle shaping optical system for shaping a bundle of rays flux of the illumination light emitted from the light source; (c) a fly-eye lens composed of a plurality of lens elements which are arranged in two-dimensionally close contact with each other so as to connect light-entering and light-exit surfaces of the lens elements to each other, while at least three refractive surfaces with a predetermined refractive power are disposed between the light-entering and light-exit surfaces in each of the lens elements, whereby the illumination light emitted from the rays-bundle shaping optical system is converged by the plurality of lens elements so as to form a surface light source; and (d) a condenser optical system which superposes the illumination light diverging from the surface light source formed by the fly-eye lens and makes it irradiate the pattern of the reticle. Also, each of the plurality of lens elements has an identical focal length f and, concerning illumination light which enters each of the lens elements in parallel to its optical axis with a maximum incident height $h_{max}$ and then is emitted therefrom with an exit angle $\theta_{max}$ substantially satisfies the above-mentioned expression (33).

In such a fly-eye lens, since the refractive surface closest to the light-exit surface of the lens element acts as a field lens, the refractive power of the lens element is substantially shared by its plurality of (two or more) refractive surfaces.

Preferably, in this case, the condenser optical system has a focal length F and, concerning the illumination light which is incident with the angle $\theta_{max}$ with respect to its optical axis coinciding with that of the fly-eye lens and forms an image with an image height $y_{max}$ on the surface to be irradiated, substantially satisfies expression (34):

$$y_{max}=F\cdot\sin\,\theta_{max} \quad (34)$$

Here, preferably, with respect to the focal length f, maximum incident angle $h_{max}$ and exit angle $\theta_{max}$ each of the plurality of lens elements satisfies expression (35):

$$|h_{max}/(f\cdot\sin\,\theta_{max})-1|<0.01 \quad (35)$$

Also, preferably, each of the plurality of lens elements is composed of a plurality of minute lenses which are arranged so as to share their optical axis while having their front-side and rear-side focal points respectively positioned on the light-entering and light-exit surfaces of each of the lens elements.

Further, preferably, the plurality of minute lenses corresponding to each other among the plurality of lens elements are arranged in two-dimensionally close contact with each other, thereby forming a plurality of lens bundles each connecting light-entering and light-exit surfaces of said minute lenses to each other.

Here, the plurality of minute lenses corresponding to each other among the plurality of lens elements may be held between two sheets of light-transmitting plates so as to form the plurality of lens bundles. Alternatively, the plurality of minute lenses corresponding to each other among the plurality of lens elements may be formed on a plurality of light-transmitting plates so as to form the plurality of lens bundles.

Also, in cases where the plurality of minute lenses in each of said plurality of lens elements are composed of a first minute lens disposed on the light-entering surface side of the lens element and a second minute lens disposed on the light-exit surface side of the lens element, whereby a plurality of the lens elements are constituted by two groups of two sheets, the first minute lens is more preferably a biconvex lens which has a first refractive surface with a radius of curvature $r_1$ on the light-entering surface side of the lens element and a second refractive surface with a radius of curvature $r_2$ on the light-exit surface side of the lens element, satisfying expressions (36) to (38):

$$r_1 > 0 \qquad (36)$$

$$r_2 < 0 \qquad (37)$$

$$|r_1| < |r_2| \qquad (38)$$

Further, when the second minute lens is a plano-convex lens with a planar light-entering surface positioned on the light-entering surface side of the lens element and, with respect to the radii of curvature $r_1$ and $r_2$, the first minute lens more preferably satisfies expression (39):

$$|r_2| = 6|r_1| \qquad (39)$$

In the following, principles in the fly-eye lens, illumination optical apparatus, and exposure apparatus of the present invention will be explained. As mentioned above, the necessary and sufficient conditions to simultaneously satisfy the uniformity of irradiance and uniformity of numerical aperture within an irradiation area are the aforesaid conditions (a) and (b). Also, the condition (a) is satisfied, namely, the light source image formed at the exit surface of a fly-eye lens becomes a perfect diffusing surface light source, when the fly-eye lens satisfies its sine condition.

However, if a fly-eye lens composed of a lens element having only two refractive surfaces is used, since the refractive surface on the exit side acts as a field lens, the refractive power (inverse number of focal length) of the individual lens element will be attributed to a single refractive surface alone.

Namely, since the refractive power of such a fly-eye lens is attributed to a single refractive surface of the individual element, the offense against the sine condition cannot be neglected in a relatively bright fly-eye lens. In this case, the uniformity of irradiance and uniformity of numerical aperture at the surface to be irradiated cannot be satisfied at the same time, thereby affecting the uniformity of the finally obtained image within the exposure field.

The inventors of the present invention have found that the sine condition can be improved when the refractive power (inverse number of focal length) of each lens element constituting a fly-eye lens is shared by a plurality of refractive surfaces without attributing it to a single refractive surface alone.

It has been well-known that the sine condition deviating amount has a magnitude corresponding to that of remaining coma (tertiary aberration). The relationship between bending and remaining coma in a single lens is disclosed, for example, in literature "McGraw-Hill, F. A. Jenkins and H. E. White: Fundamental of Optics, 4th ed., pp. 162–165, 1981." According to this literature, the sine condition can be greatly changed by the bending with two surfaces of a single lens alone.

Therefore, in accordance with the present invention, the sine conditon lacking amount in the fly-eye lens can be reduced so as to substantially satisfy condition (a), thereby improving the uniformity in both irradiance and illumination numeric aperture.

Further, in cases where the condition of expression (33) is satisfied, from expression (23), the offense against the sine condition of the fly-eye lens becomes 1% or less.

Accordingly, from expression (32), the illumination numerical aperture at the surface to be irradiated can be prevented from fluctuating by more than 3%.

Also, when each of the plurality of lens elements constituting the fly-eye lens is composed of two groups of two minute lens sheets sharing an optical axis, while the minute lens positioned on the light-exit side facing the light source is a biconvex lens and expression (38) is established in the minute lens on the light-entering surface side of the lens element, the refractive power of the light-entering surface of that minute lens becomes greater than that of its light-exit surface. Accordingly, even when the illumination light is of the ultraviolet region such as g-line or i-line of a mercury lamp, the sine condition can be satisfied by using a glass material which has a practical refractive index of 2 or less.

In this case, when the minute lens disposed on the light-exit side facing the surface to be irradiated is a planar-convex lens having a planar light-entering surface ($1/r_3 = 0$) and expression (39) is established in the minute lens on the light-entering surface side of the lens element, the sine condition is satisfied most accurately.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

Figure 1:
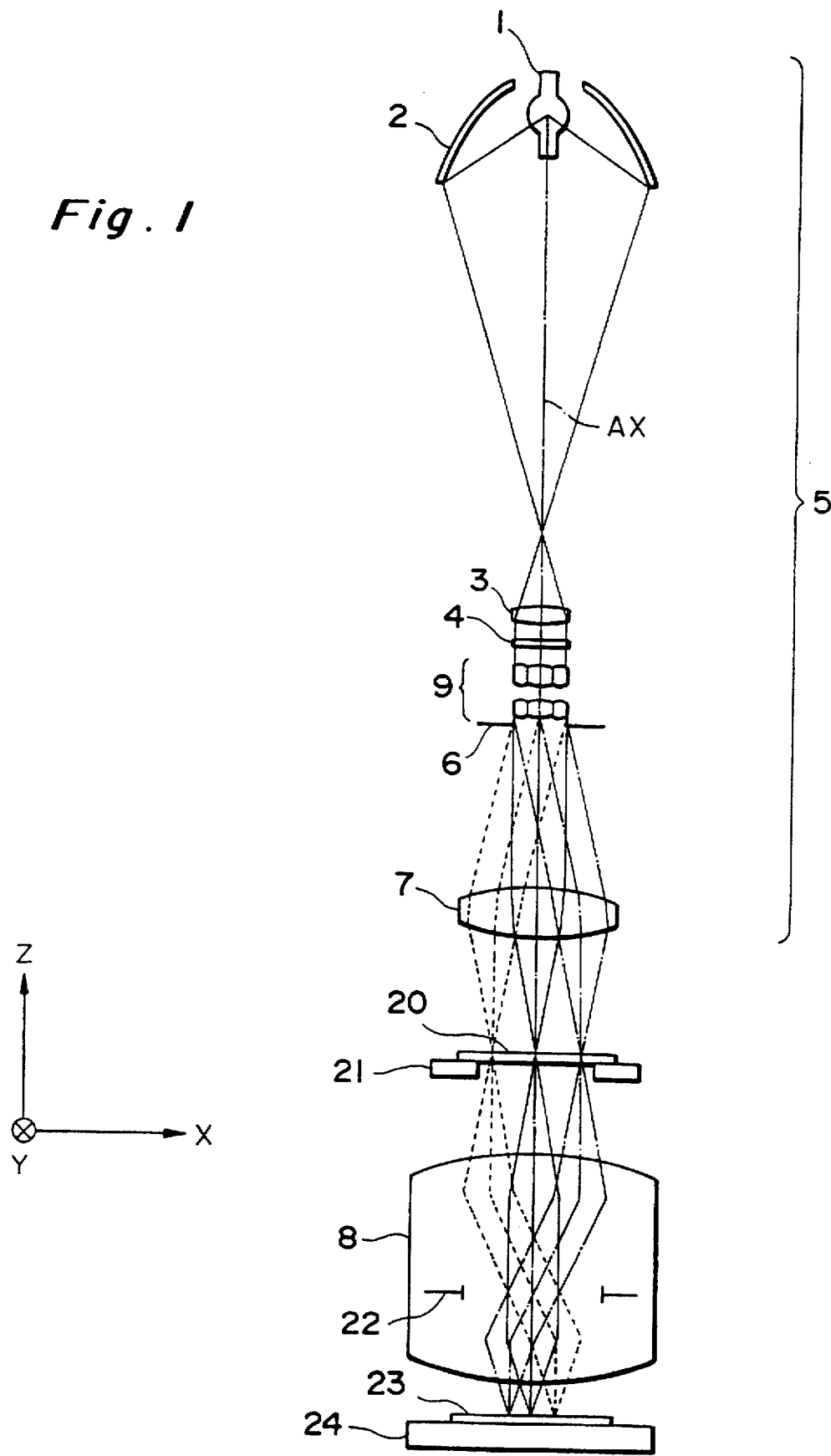
FIG. 1 is an optical path diagram showing a configuration of an embodiment of the exposure apparatus in accordance with the present invention.

In the following, the configuration and operation of an embodiment of the exposure apparatus in accordance with the present invention will be explained in detail with reference to FIGS. 1 to 7. The exposure apparatus of this embodiment is used for making various semiconductor devices, liquid crystal display devices, and the like and equipped with an illumination optical apparatus including a fly-eye lens which has characteristic features of the present invention. In the explanation of the drawings, identical elements are referred to with identical marks without repeating their overlapping explanations. Also, the dimensional ratios in the drawings do not always correspond to those in the explanation.

As shown in FIG. 1, the exposure apparatus of this embodiment comprises a reticle stage 21 holding a reticle 20; a wafer stage 24 holding a wafer 23; an illumination optical apparatus 5 for irradiating a pattern area formed within the reticle 20 with illumination light; and a projection optical apparatus 8 for forming an image of the illumination light as exposure light, which has been subjected to interference according to the pattern of the reticle 20, upon an exposure area defined in the wafer 23.

Figure 2:
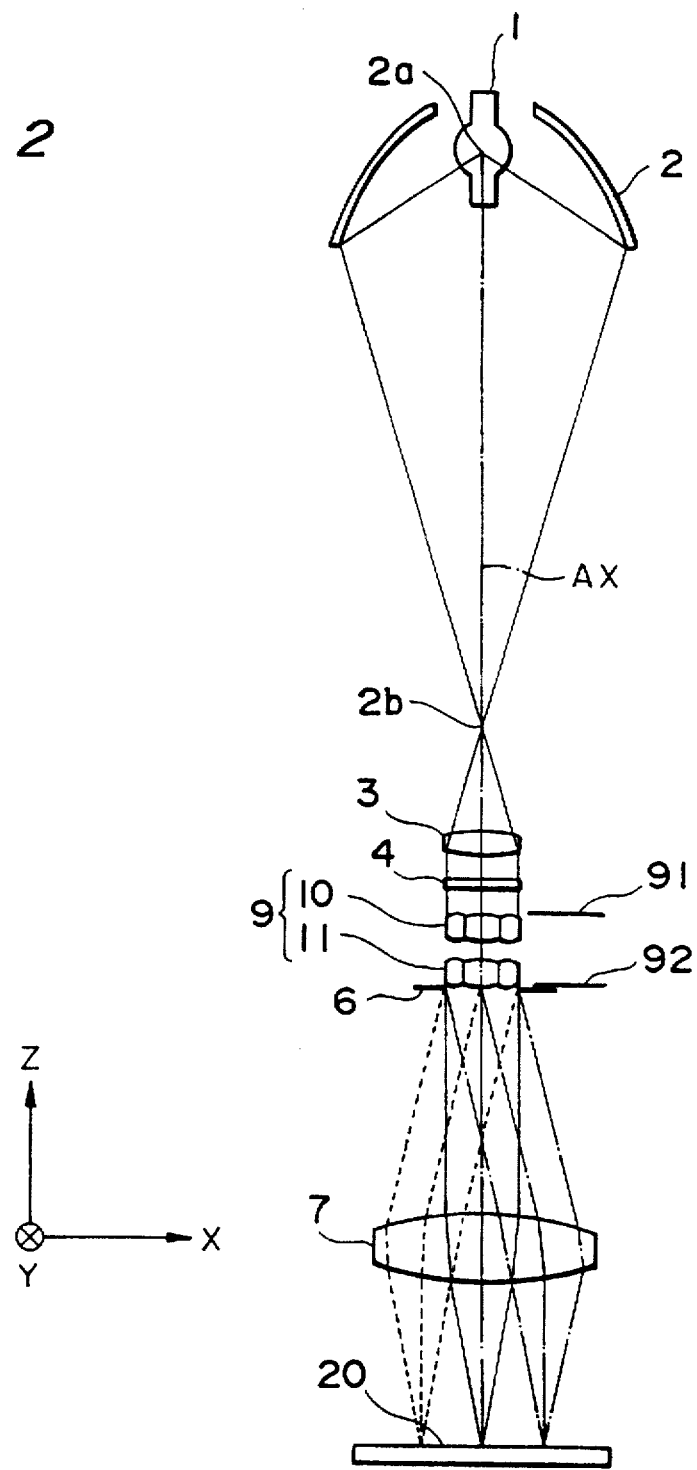
FIG. 2 is an optical path diagram showing a configuration of the illumination optical apparatus loaded in the exposure apparatus shown in FIG. 1.

As shown in FIG. 2, in the illumination optical apparatus 5, a light source 1 composed of a mercury lamp is disposed at a first focal point 2a of a converging mirror 2 having a reflective surface composed of a spheroidal surface. Accordingly, at a second focal point 2b of the converging mirror 2, a light source image is formed as a secondary light source. Along an optical axis AX of the illumination optical apparatus 5 connecting the first and second focal points 2a and 2b of this converging mirror 2 together, a collimator lens 3, a band-pass filter 4, a fly-eye lens 9, a first aperture stop 6, and a condenser lens 7 are successively disposed in front of the converging mirror 2.

A bundle of rays diverging from the secondary light source disposed at the second focal point 2b of the converging mirror 2 is converted by the collimator lens (rays-bundle shaping optical system) 3 into a substantially parallel bundle of rays and then enters the band-pass filter 4. Then, the illumination light having an exposure wavelength [e.g., g-line (wavelength: 436 nm) or i-line (wavelength: 365 nm) of the mercury lamp] selected by the band-pass filter 4 enters an entering-side surface 91 of the fly-eye lens 9 composed of numerous lens elements, thereby forming numerous light source images on an exit-side surface 92 of the fly-eye lens 9 as tertiary light sources.

The first aperture stop 6 is disposed at the exit-side surface 92 of the fly-eye lens 9. The bundle of rays diverging from the numerous tertiary light sources within the aperture of the first aperture stop 6 are converged by a condenser lens (condenser optical system) 7 so as to illuminate, in a superposing manner, the illumination area on the pattern-forming surface of the reticle 20, in which a projection exposure pattern has been written, with a uniform irradiance distribution. In FIG. 1, Z-axis is taken in parallel to the optical axis AX of the illumination optical apparatus 5, X-axis is taken in a direction which is perpendicular to Z-axis and in parallel to the paper surface of FIG. 1, and Y-axis is taken in a direction perpendicular to the paper surface of FIG. 1.

In this case, the second focal point 2b of the converging mirror 2 and the exit-side surface 92 of the fly-eye lens 9 have an optically conjugate relationship with the light source 1. The numerical aperture (NA) of the illumination optical apparatus 5 at the illumination area of the reticle 20, which is the surface to be irradiated, is determined by the aperture size of the first aperture stop 6 disposed at the exit-side surface 92. The numerical aperture of the illumination optical apparatus 5 (referred to as "illumination numerical aperture" in the following) is set to an optimal value in view of the numerical aperture of the projection optical apparatus 8, the pattern size of the reticle 20, and the like, since it may greatly influence the resolving power, depth of focus, and image quality, for example.

Also, the surface to be irradiated, at which the illumination area is disposed as the pattern-forming surface of the reticle 20, is conjugate with an inlet-side surface 91 of the fly-eye lens 9, whereby the inlet surfaces of the numerous lens elements constituting the fly-eye lens 9 respectively become field stops. The bundle of rays restricted by these field stops are superposed on each other upon the surface to be irradiated by way of the condenser lens 7.

Figure 3:
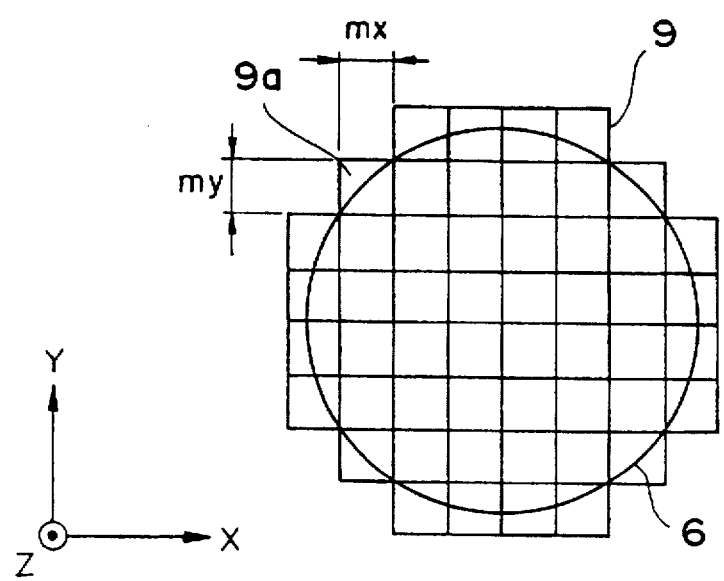
FIG. 3 is a side view, in a plane perpendicular to the optical axis, showing a configuration of the fly-eye lens disposed in the illumination optical system shown in FIG. 2.

As shown in FIG. 3, cross sections of the numerous lens elements constituting the fly-eye lens 9 are determined so as to become analogous to the form of the illumination area of the reticle 20. In an exposure apparatus for making semiconductor devices (semiconductor exposure apparatus), since a transfer pattern is formed in a rectangular area on the reticle 20 in general, the illumination area also becomes rectangular. Accordingly, the fly-eye lens 9 is assembled such that the lens elements 9a each having a rectangular cross section are densely arranged together so as to have an extent including the maximum aperture size of the first aperture stop 6.

Namely, the fly-eye lens 9 is constituted by numerous lens elements 9a, whose widths in X and Y directions are respectively mx and my, arranged in close contact with each other in X and Y directions. Also, as indicated by continuous curve, the maximum circular aperture of the first aperture stop 6 is enclosed within the outline of the cross section of the fly-eye lens 9.

As shown in FIG. 1, the projection optical apparatus 8 is disposed between the reticle stage 21 and the wafer stage 23 with its optical axis coinciding with the optical axis AX of the illumination optical apparatus 5. The numerical aperture of this projection optical apparatus 8 is determined by the aperture size of a second aperture stop 22 disposed therewithin, thereby setting the minimum line width of the exposure pattern on the wafer 23 at an optimum value.

The bundle of rays diverging from the reticle 20 as exposure light is converged by the projection optical apparatus 8 and then restricted by the second aperture stop 22. Thereafter, it forms an image at the exposure area of the wafer 23 on the projection surface with an optical intensity distribution corresponding to the pattern distribution of the reticle 20. Accordingly, the photosensitive resist coated on the surface of the wafer 23 is exposed, with the same magnification or a reduced magnification, to the projection exposure pattern formed in the reticle 20.

In this case, the irradiation surface where the illumination area of the reticle 20 set at the reticle stage 21 is disposed and the projection surface where the exposure area of the wafer 23 set at the wafer stage 24 is disposed have an optically conjugate relationship with each other with respect to the projection optical apparatus 8. Also, the first aperture stop 6 and the second aperture stop 22 are disposed so as to have an optically conjugate relationship with each other.

Figure 4A:
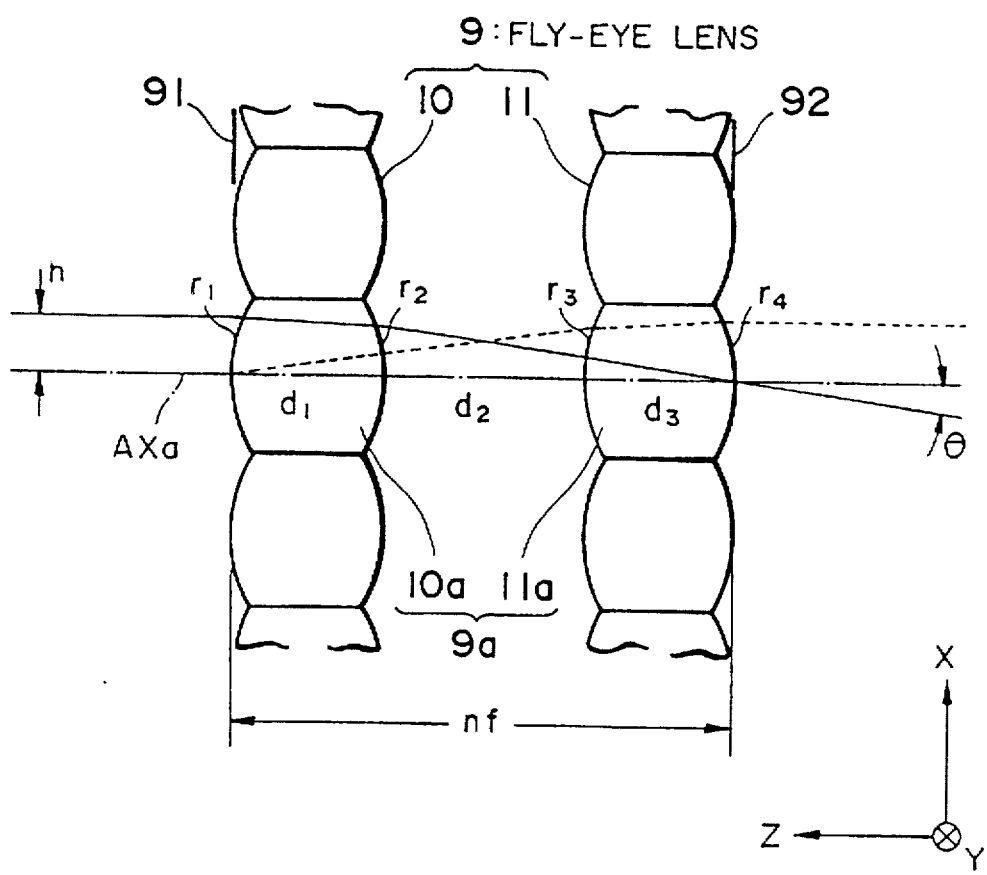
FIG. 4a is a front view, in a plane parallel to the optical axis, showing one configuration of the fly-eye lens disposed in the illumination optical system shown in FIG. 2.

As shown in FIG. 4a, the fly-eye lens 9 comprises a first lens bundle 10 and a second lens bundle 11 which are disposed along the optical axis AX of the illumination optical axis 5 with a predetermined space therebetween.

The first lens bundle 10 on the light source side is formed by numerous minute lens elements 10a, each of which has a rectangular cross section, bundled in two-dimensionally close contact to each other. Similarly, the second lens bundle 11 facing the surface to be irradiated is formed by numerous minute lens elements 11a, each of which has a rectangular cross section identical to that of the minute lens element 10a, bundled in two-dimensionally close contact to each other.

Also, the minute lens 10a constituting the first lens bundle 10 and the minute lens 11a constituting the second lens bundle 11 are coaxially disposed, such that the minute lenses 10a and 11a sharing a single optical axis constitute one lens element 9a of the fly-eye lens 9. Namely, the lens element 9a of the fly-eye lens 9 is constituted by two groups of two sheets of minute lenses 10a and 11a sharing an optical axis AXa. According to such a configuration of two groups of two sheets, the sine condition of the individual lens element 9a constituting the fly-eye lens 9 is corrected.

Also, in the lens element 9a constituting the fly-eye lens 9 of this embodiment, the front-side focal point of the lens element 9a is disposed at the inlet surface of the minute lens 10a (i.e., the inlet-side surface 91 of the fly-eye lens 9) on the light source side, while the rear-side focal point of the lens element 9a is disposed at the exit surface of the minute lens 11a (i.e., the exit-side surface 92 of the fly-eye lens 9) facing the surface to be irradiated. Accordingly, the parallel bundle of rays entering the lens element 9a from the light source side is converged by the exit surface of the minute lens 11a, whereas the parallel bundle of rays entering the lens element 9a from the side facing the surface to be irradiated is converged by the inlet surface of the minute lens 10a.

In the individual lens element 9a constituting the fly-eye lens 9, the sine condition is corrected by two groups of two sheets of the minute lenses 10a and 11a. Namely, concerning the bundle of rays parallelly and uniformly entering the lens element 9a from the collimator lens 4, the incident height h of the bundle of rays with respect to the lens element 9a, the focal length f of the lens element 9a, and the exit angle θ of the bundle of rays with respect to the lens element 9a are set so as to establish the relationship indicated by the above-mentioned expression (22):

$$h = f \cdot \sin \theta \quad (22)$$

Accordingly, the tertiary light sources formed at the exit-side surface 92 of the fly-eye lens 9 become a perfect diffusing surface light source (Lambert surface).

On the other hand, the image height y of the bundle of rays at the illumination area of the condenser lens 7, the focal length F of the condenser lens 7, and the incident angle θ of the bundle of rays with respect to the condenser lens 7 are set so as to establish the relationship indicated by the above-mentioned expression (1):

$$y = F \cdot \sin \theta \quad (1)$$

Accordingly, the illumination area of the condenser lens 7, namely, the surface of the reticle 20 to be irradiated, has uniform irradiance and numerical aperture independent of the position.

Here, in an example of the method of making the fly-eye lens 9, the first lens bundle 10 is assembled as an integral optical member by bonding the minute lenses 10a together side by side, while the second lens bundle 11 is similarly assembled as an integral optical member by bonding the minute lenses 11a together side by side. In this case, the optical axes of the first and second lens bundles 10 and 11 are mechanically adjusted.

Figure 5:
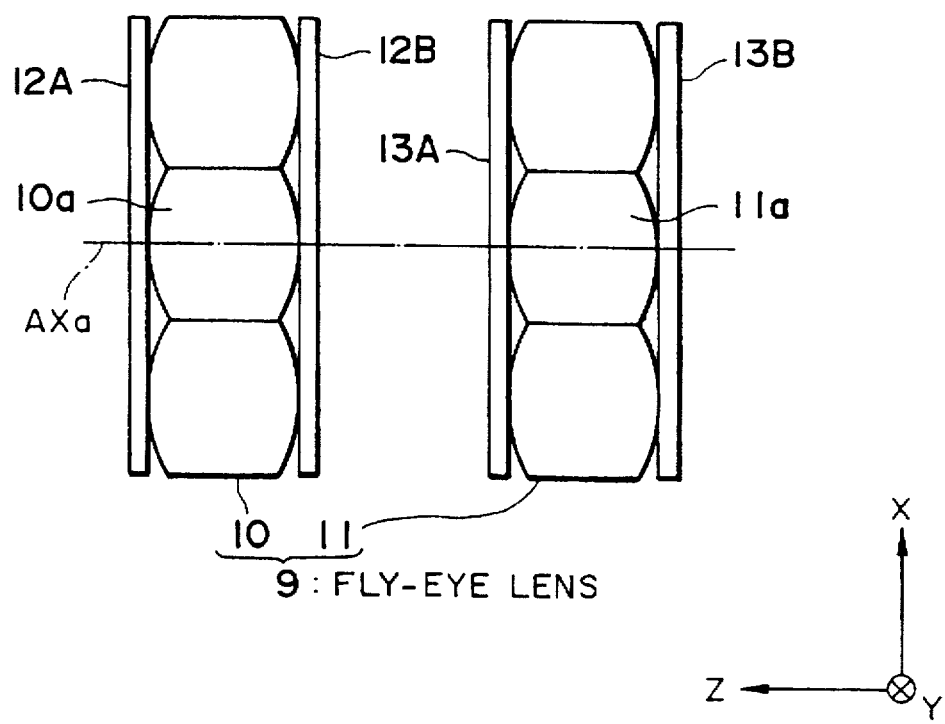
FIG. 5 is a side view, in a plane parallel to the optical axis, showing a configuration of a first modified example of the fly-eye lens disposed in the illumination optical system shown in FIG. 2.

In a first modified example of the method of making the fly-eye lens 9, on the other hand, as shown in FIG. 5, the first lens bundle 10 may be formed by holding the minute lenses 10a between two light-transmitting plane parallel plates 12A and 12B without bonding the minute lenses 10a together, while the second lens bundle 11 may be similarly formed by holding the minute lenses 11a between two light-transmitting plane parallel plates 13A and 13B without bonding the minute lenses 11a together. Also, in this case, the optical axes of the first and second lens bundles 10 and 11 are mechanically adjusted.

Figure 6:
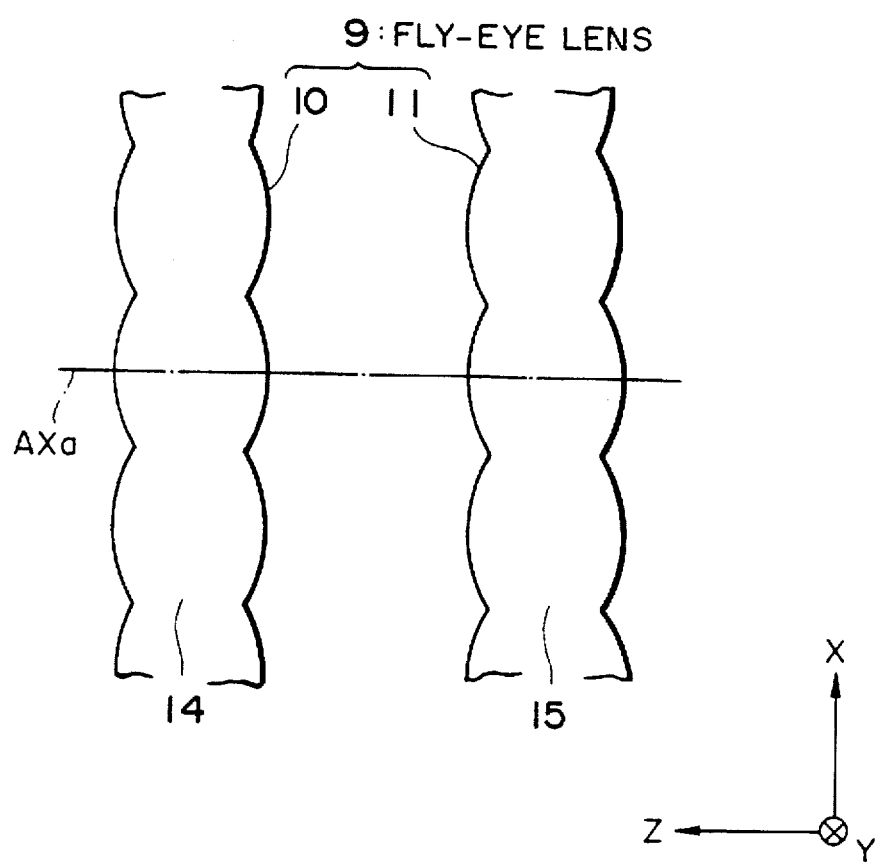
FIG. 6 is a side view, in a plane parallel to the optical axis, showing a configuration of a second modified example of the fly-eye lens disposed in the illumination optical system shown in FIG. 2.

Further, in a second modified example of the method of making the fly-eye lens 9, as shown in FIG. 6, surfaces of a glass substrate 14 may be pressed into numerous minute lenses each having a predetermined refractive surface so as to form the first lens bundle 10, while surfaces of a glass substrate 15 may be pressed into numerous minute lenses each having a predetermined refractive surface so as to form the second lens bundle 11. Also, in this case, the optical axes of the first and second lens bundles 10 and 11 are mechanically adjusted.

In the following, specific test examples of the fly-eye lens 9 in this embodiment will be explained. In the following test examples, as shown in FIG. 4, the surfaces through which the illumination light from the light source side passes are successively referred to as i-th surface (wherein i=1 to 4), the sign of radius of curvature $r_i$ of the i-th surface is defined as positive when it is convex with respect to the bundle of rays from the light source side, and the focal length f of the fly-eye lens 9 is standardized to 1. Also, the surface distance between the i-th surface and the (i+1)-th surface is defined as $d_i$, while the refractive index between the i-th surface and the (i+1)-th surface is defined as $n_i$. The wavelength of the illumination light (used wavelength), the glass material used for the fly-eye lens 9, and the refractive index of this glass material with respect to the used wavelength are as follows:

used wavelength: 365 nm (i-line of mercury lamp)

glass material: quartz refractive index of quartz: 1.474552

First Test Example

Figure 4B:
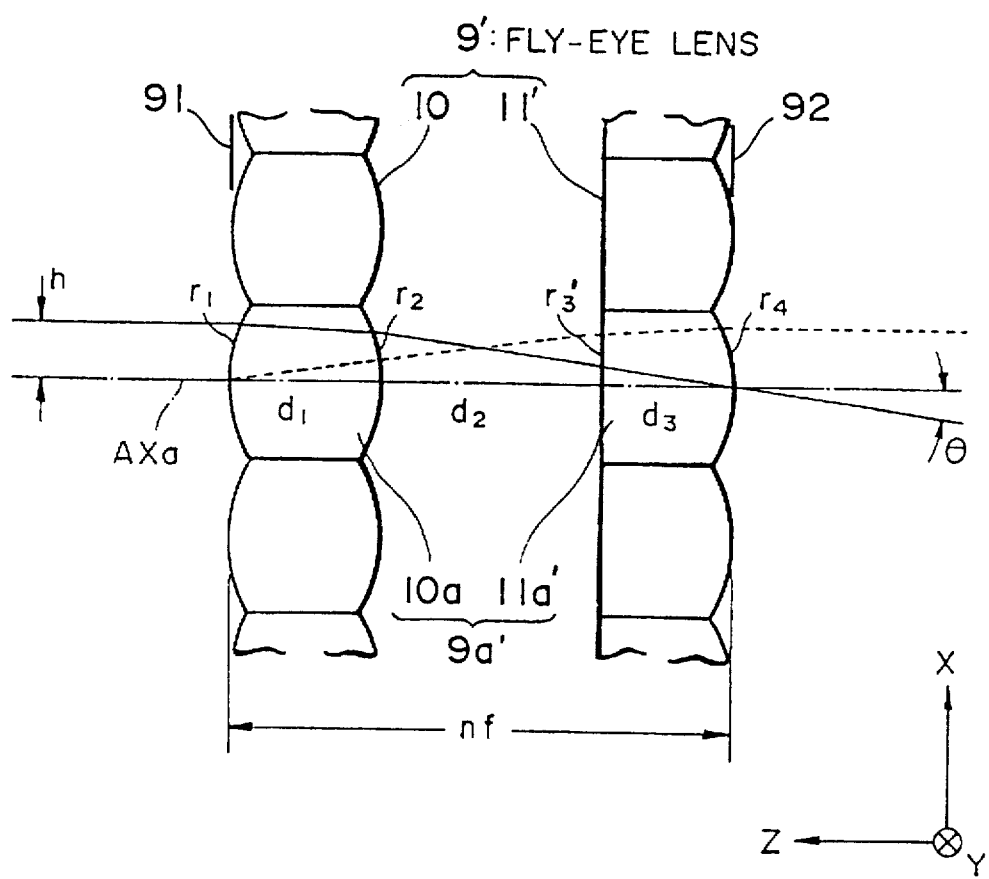
FIG. 4b is a front view, in a plane parallel to the optical axis, showing another configuration of the fly-eye lens disposed in the illumination optical system shown in FIG. 2.

In the first test example, in the individual lens element 9a constituting the fly-eye lens 9 shown in FIG. 4b, the minute lens 10a on the light source side is formed as a biconvex lens, while the minute lens 11a facing the surface to be irradiated is formed as a plane-convex lens having a planar surface on the light source side, so as to effect a correction in order to satisfy the sine condition. Specific lens data are shown in Table 1.

TABLE 1

| Radius of curvature | Surface distance | Refractive index |
| --- | --- | --- |
| $r_1 = 0.59$ | $d_1 = 0.3$ | $n_1 = 1.474552$ |
| $r_2 = -2.0283$ | $d_2 = 0.6329$ | $n_2 = 1.0$ |
| $r_3 = \infty$ | $d_3 = 0.3$ | $n_3 = 1.474552$ |
| $r_4 = -0.4983$ | | |

Based on these lens data, when value OSC/f, in which the offense against the sine condition OSC defined by the above-mentioned expression (23) is standardized with the focal length of the fly-eye lens 9, is calculated with respect to various 2h/f values (i.e., inverse number of F number), the values shown in Table 2 are obtained.

TABLE 2

| | |
|---|---|
| $2h/f = 0.1$ | $OSC/f = -0.0002\%$ |
| $2h/f = 0.2$ | $OSC/f = -0.0400\%$ |
| $2h/f = 0.3$ | $OSC/f = -0.0600\%$ |
| $2h/f = 0.4$ | $OSC/f = -0.0250\%$ |
| $2h/f = 0.5$ | $OSC/f = -0.1322\%$ |

From Table 2, it can be seen that the offense against the sine condition is only about 0.1% even when the value of $2h/f$ is 0.5 (F number is 2) in this test example. By contrast, as will be explained later, the offense against the sine condition is greater than 1% when the conventional fly-eye lens, in which lens elements each composed of a single lens are bundled, is used. Thus, the sine condition is quite favorably corrected in this test example. Accordingly, in the illumination optical system using the fly-eye lens 9 of this test example, the uniformity of both irradiance and numerical aperture at the surface to be irradiated can be set at a very high level.

Second Test Example

In the second test example, in the individual lens element 9a constituting the fly-eye lens 9 shown in FIG. 4a, the minute lens 10a on the light source side and the minute lens 11a facing the surface to be irradiated are formed as biconvex lenses which are analogous to each other, so as to effect a correction in order to satisfy the sine condition. Specific lens data are shown in Table 3.

TABLE 3

| Radius of curvature | Surface distance | Refractive index |
|---|---|---|
| $r_1 = 0.63129$ | $d_1 = 0.3$ | $n_1 = 1.474552$ |
| $r_2 = -2.00792$ | $d_2 = 0.67612$ | $n_2 = 1.0$ |
| $r_3 = 2.00792$ | $d_3 = 0.3$ | $n_3 = 1.474552$ |
| $r_4 = -0.63129$ | | |

Based on these lens data, when value $OSC/f$, in which the offense against the sine condition OSC defined by the above-mentioned expression (23) is standardized with the focal length of the fly-eye lens 9, is calculated with respect to various $2h/f$ values (i.e., inverse number of F number), the values shown in Table 4 are obtained.

TABLE 4

| | |
|---|---|
| $2h/f = 0.1$ | $OSC/f = 0.0000\%$ |
| $2h/f = 0.2$ | $OSC/f = -0.0020\%$ |
| $2h/f = 0.3$ | $OSC/f = -0.00333\%$ |
| $2h/f = 0.4$ | $OSC/f = -0.0050\%$ |
| $2h/f = 0.5$ | $OSC/f = 0.1522\%$ |

From this table, it can be seen that, as in the case of the first test example, the sine condition of this test example is quite favorably corrected.

Namely, in the lens element 9a having the focal length f in the fly-eye lens 9, with respect to a bundle of rays which uniformly enters the lens element 9a in parallel to its optical axis with a maximum incident height $h_{max}$ and then is emitted therefrom with an exit angle $\theta_{max}$, the relationship indicated by the above-mentioned expression (33) is substantially satisfied:

$$h_{max} = f \cdot \sin \theta_{max} \tag{33}$$

More specifically, the relationship indicated by the above-mentioned expression (35) is preferably established:

$$|h_{max}/(f \cdot \sin \theta_{max}) - 1| < 0.01 \tag{35}$$

In this case, in the condenser lens having a focal length F, concerning a bundle of rays which is incident with the angle $\theta_{max}$ with respect to the optical axis thereof coinciding with that of the fly-eye lens and forms an image with an image height $y_{max}$ on the surface to be irradiated, the relationship indicated by the above-mentioned expression (34) has to be substantially satisfied:

$$y_{max} = F \cdot \sin \theta_{max} \tag{34}$$

Further, various constitutional examples have been studied while such parameters as thickness and refractive index of the two kinds of minute lenses 10a and 11b are changed. As a result, in cases where the lens element 9a of the fly-eye lens 9 is composed of two groups, it has been found that the sine condition of the fly-eye lens 9 can be optimized when, within a practical range of refractive index, the conditions indicated by the above-mentioned expressions (36) to (38) are established with respect to the radius of curvature $r_1$ of the inlet surface and radius of curvature $r_2$ of the exit surface of the first group disposed on the light source side:

$$r_1 > 0 \tag{36}$$

$$r_2 < 0 \tag{37}$$

$$|r_1| < |r_2| \tag{38}$$

Among these conditions, those of expressions (36) and (38) mean that the first group is a biconvex lens.

In particular, when the second minute lens is formed with a planar inlet surface, as shown in FIG. 4b, in order to optimize the sine condition, the conditions indicated by the above-mentioned expressions (36), (37), and (39) are preferably established:

$$r_1 > 0 \tag{36}$$

$$r_2 < 0 \tag{37}$$

$$|r_2| = 6|r_1| \tag{39}$$

While the lens element 9a of the fly-eye lens 9 is constituted by two groups of two sheets in the above-mentioned embodiment, it may be constituted by two groups of three or more sheets. Further, each lens element 9a may be constituted by three or more groups, thereby enabling higher correction. When three or more groups are used in this manner, a configuration in which a concave lens group is incorporated therein may be used. However, such a configuration may be practically difficult in view of maintenance of accuracy in the optical axis of each lens element.

In this manner, without being restricted to the above-mentioned embodiment, the present invention may have various configurations as long as they do not deviate from the gist of the invention.

Figure 7:
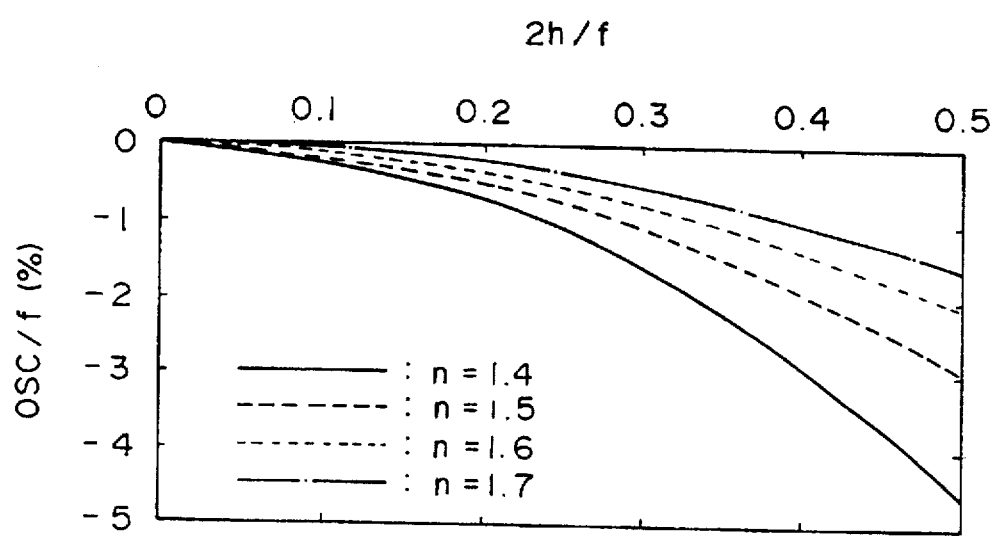
FIG. 7 is a graph showing a characteristic of the conventional fly-eye lens concerning changes in its offense against the sine condition with respect to F value.

FIG. 7 shows changes in function $DS(\theta)(=OSC/f)$ of the offense against the sine condition OSC in the case where the conventional fly-eye lens, which is made of a bundle of lens elements each comprising a single lens and in which opposite refractive surfaces respectively become focal positions of the other refractive surfaces, is used. In FIG. 7, the function $DS(\theta)$ is represented as a function of $2h/f$ (i.e., inverse number of F number) for the cases where the refractive index n of the lens element of the fly-eye lens is 1.4 to 1.7. As can be seen from FIG. 7, the function $DS(\theta)$ becomes smaller as the refractive index of the lens element of the fly-eye lens is maximized and as the lens is used in the area where the image height h is smaller, whereby the uniformity of illumination numerical aperture can be secured to a certain extent.

However, since the exposure wavelength used in the semiconductor exposure apparatus is in the ultraviolet region and it is not easy in the ultraviolet region to obtain a glass material having a high refractive index with excellent transmittance and ultraviolet resistance, the glass material for the lens element is practically limited to a material whose refractive index is about 1.5. Further, while the focal length f of the fly-eye lens may be made greater than that of the maximum value $h_{max}$ for the image height h in order to reduce 2h/f, it also becomes necessary for the focal length of the condenser lens to be increased in order to secure an illumination area having a predetermined size, thereby increasing the size of the illumination optical system.

Accordingly, as shown in FIG. 7, when the conventional fly-eye lens is used, it is difficult for the function $DS(\theta)(= OSC/f)$ of the offense against the sine condition OSC to decrease to a value less than 1% without increasing the size of the apparatus as a whole. As a result, in view of the above-mentioned expression (32), the illumination numerical aperture NA(y) is not easily prevented from fluctuating by more than 3%.

In the illumination optical apparatus in accordance with the present invention, each of the plurality of lens elements constituting the fly-eye lens has at least three refractive surfaces with a predetermined refractive index. Since one of these surfaces acts as a field lens, the refractive power of the individual lens element is shared by at least two refractive surfaces, whereby its sine condition can be easily corrected. Accordingly, the offense against the sine condition of the fly-eye lens can be reduced without increasing the size of the apparatus, thereby advantageously improving the uniformity of both irradiance and illumination numerical aperture. As a result, when the present invention is used as an illumination optical system in the projection exposure apparatus, the uniformity of the obtained projection image in the exposure field can be greatly improved.

Also, when the condition of the above-mentioned expression (33) is satisfied, the offense against the sine condition of the fly-eye lens can be reduced to a value less than 1%. As a result, the uniformity of illumination numerical aperture on the surface to be irradiated can be prevented from fluctuating by more than 3%. Accordingly, when used in the projection exposure apparatus, for example, a favorable image-forming characteristic can be obtained.

Also, when the lens element constituting the fly-eye lens is constituted by a plurality of minute lenses sharing an optical axis, the radii of curvature and refractive indices of their refractive surfaces can be selected in combination so as to easily correct the sine condition of the fly-eye lens.

Further, when each of a plurality of lens elements constituting the fly-eye lens is made of two groups of two sheets of minute lenses sharing an optical axis, while the minute lens on the light source side is made as a biconvex lens, so as to satisfy the condition of the above-mentioned expression (38) or (39), the sine condition of the fly-eye lens can be easily corrected within a practical range of refractive index even in such a simple configuration of two groups of two sheets.

Also, in the fly-eye lens in accordance with the present invention, in a simple configuration, the offense against the sine condition can be advantageously reduced to a value less than 1%. Accordingly, the fly-eye lens of the present invention can be used in the illumination optical apparatus and exposure apparatus of the present invention.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 062429/1995 (7-062429) filed on Mar. 22, 1995 is hereby incorporated by reference.

What is claimed is:

1. A fly-eye lens consisting of:

a first bundle of lens elements which are arranged in two-dimensionally close contact with each other so as to connect light-entering surfaces of said first bundle of lens elements to each other; and a second bundle of lens elements which are arranged in two-dimensionally close contact with each other so as to connect light-exiting surfaces of said second bundle of lens elements to each other, wherein each of said lens elements in said first bundle has a biconvex shape with an entering side lens surface with a radius of curvature $r_1$, and an exiting side lens surface with a radius of curvature $r_2$, and wherein each of said lens elements in said first bundle and said second bundle has a focal length f and, when a bundle of rays enters said lens elements in said first bundle in parallel to an optical axis of said lens elements in said first bundle with a maximum incident height $h_{max}$ and is emitted therefrom with an exit angle $\theta_{max}$, where following conditions are substantially satisfied:

$$h_{max} = f \sin \theta_{max}$$

and $$|r_1| < |r_2|.$$

2. A fly-eye lens according to claim 1, wherein, with respect to said focal length f, maximum incident angle $h_{max}$, and exit angle $\theta_{max}$, each of said lens elements in said first bundle and in said second bundle satisfies a conditional expression:

$$|h_{max}/(f \sin \theta_{max}) - 1| < 0.01.$$

3. A fly-eye lens according to claim 1, wherein each of said lens elements in said first bundle and in said second bundle is composed of a plurality of minute lenses which are arranged so as to share their optical axis while having their front-side and rear-side focal points respectively positioned on the light-entering and light-exit surfaces of each of said lens elements in said first bundle and in said second bundle.

4. A fly-eye lens according to claim 3, wherein said plurality of minute lenses corresponding to each other among said lens elements in said first bundle and in said second bundle are arranged in two-dimensionally close contact with each other so as to form a plurality of lens bundles each connecting light-entering and light-exit surfaces of said plurality of minute lenses to each other.

5. A fly-eye lens according to claim 4, wherein said plurality of minute lenses corresponding to each other among said lens elements in said first bundle and in said second bundle are held between two sheets of light-transmitting plates so as to form said plurality of lens bundles.

6. A fly-eye lens according to claim 4, wherein said plurality of minute lenses corresponding to each other among said lens elements in said first bundle and in said second bundle are formed on a plurality of light-transmitting substrates so as to form said plurality of lens bundles.

7. A fly-eye lens according to claim 3, wherein said plurality of minute lenses in each of said lens elements in said first bundle and in said second bundle are composed of a first minute lens disposed on the light-entering side of said corresponding lens element in said first bundle and in said second bundle and a second minute lens disposed on the light-exit side of said corresponding lens element in said first bundle and in said second bundle, wherein a plurality of lens elements are constituted by two groups of two sheets, said first minute lens being a biconvex lens which has a first refractive surface with a radius of curvature $r_1$ on the light-entering surface side of said corresponding lens element in said first bundle and in said second bundle, and a second refractive surface with a radius of curvature $r_2$ on the light-exit surface side of said corresponding lens element in said first bundle and in said second bundle, satisfying a conditional expression:

$$|r_1|<|r_2|.$$

8. A fly-eye lens according to claim 7, wherein said second minute lens is a plano-convex lens with a planar surface positioned on the light-entering surface of said corresponding lens element in said first bundle and in said second bundle and, with respect to said radii of curvature $r_1$ and $r_2$, said first minute lens satisfies a conditional expression:

$$|r_2|=6|r_1|.$$

9. An illumination optical apparatus consisting of:
a light source for generating illumination light;
a rays-bundle shaping optical system for shaping a bundle of rays of said illumination light emitted from said light source;
a fly-eye lens including a first bundle of lens elements which are arranged in two-dimensionally close contact with each other so as to connect light-entering surfaces of said first bundle of lens elements to each other, said fly-eye lens also including a second bundle of lens elements which are arranged in two-dimensionally close contact with each other so as to connect light-exiting surfaces of said second bundle of lens elements to each other, wherein said illumination light emitted from said rays-bundle shaping optical system is converged by said first bundle and diverged by said second bundle of lens elements so as to form a surface light source; and
a condenser optical system which superposes said illumination light diverging from said surface light source formed by said fly-eye lens so as to make said illumination light irradiate a surface to be irradiated,
wherein each of said lens elements in said first bundle has a biconvex shape with an entering side lens surface with a radius of curvature $r_1$, and an exiting side lens surface with a radius of curvature $r_2$, and
wherein each of said lens elements in said first bundle and said second bundle has a focal length f and, when said illumination light enters said lens elements of said first bundle in parallel to an optical axis of said lens elements in said first bundle with a maximum incident height $h_{max}$ and is emitted therefrom with an exit angle $\theta_{max}$, where following conditions are substantially satisfied:

$$h_{max}=f\cdot\sin\theta_{max},$$

$$|r_1|<|r_2|.$$

10. An illumination optical apparatus according to claim 9, wherein said condenser optical system has a focal length F and, concerning said illumination light which is incident with said angle $\theta_{max}$ with respect to its optical axis coinciding with that of said fly-eye lens and then forms an image, with an image height $y_{max}$ on said surface to be irradiated, substantially satisfies a conditional expression:

$$y_{max}=F\cdot\sin\theta_{max}.$$

11. A fly-eye lens according to claim 9, wherein, with respect to said focal length f, maximum incident angle $h_{max}$, and exit angle $\theta_{max}$, each of said lens elements in said first bundle and in said second bundle satisfies a conditional expression:

$$|h_{max}/(f\cdot\sin\theta_{max})-1|<0.01.$$

12. A fly-eye lens according to claim 9, wherein each of said lens elements in said first bundle and in said second bundle is composed of a plurality of minute lenses which are arranged so as to share their optical axis while having their front-side and rear-side focal points respectively positioned on the light-entering and light-exit surfaces of each of said lens elements in said first bundle and in said second bundle.

13. A fly-eye lens according to claim 12, wherein said plurality of minute lenses corresponding to each other among said lens elements in said first bundle and in said second bundle are arranged in two-dimensionally close contact with each other so as to form a plurality of lens bundles each connecting light-entering and light-exit surfaces of said plurality of minute lenses to each other.

14. A fly-eye lens according to claim 12, wherein said plurality of minute lenses in each of said lens elements in said first bundle and in said second bundle are composed of a first minute lens disposed on the light-entering side of said corresponding lens element in said first bundle and in said second bundle and a second minute lens disposed on the light-exit side of said corresponding lens element in said first bundle and in said second bundle, wherein a plurality of lens elements are constituted by two groups of two sheets, said first minute lens being a biconvex lens which has a first refractive surface with a radius of curvature $r_1$ on the light-entering surface side of said corresponding lens element in said first bundle and in said second bundle, and a second refractive surface with a radius of curvature $r_2$ on the light-exit surface side of said corresponding lens element in said first bundle and in said second bundle, satisfying a conditional expression:

$$|r_1|<|r_2|.$$

15. A fly-eye lens according to claim 14, wherein said second minute lens is a plano-convex lens with a planar surface positioned on the light-entering surface of said corresponding lens element in said first bundle and in said second bundle and, with respect to said radii of curvature $r_1$ and $r_2$, said first minute lens satisfies a conditional expression:

$$|r_2|=6|r_1|.$$

16. An exposure apparatus consisting of:
a reticle stage holding a reticle within which a projection exposure pattern is formed;
a wafer stage holding a wafer whose surface is coated with a photosensitive resist;
an illumination optical apparatus for irradiating the pattern of said reticle with illumination light; and
a projection optical apparatus for forming an image of said illumination light as exposure light, which has been subjected to interference according to the pattern of said reticle, upon said wafer,
wherein said illumination optical apparatus comprises:
a light source for generating said illumination light;
a rays-bundle shaping optical system for shaping a bundle of rays of said illumination light emitted from said light source;
a fly-eye lens including a first bundle of lens elements which are arranged in two-dimensionally close contact with each other so as to connect light-entering surfaces of said first bundle of lens elements to each other, said fly-eye lens also including a second bundle of lens elements which are arranged in two-dimensionally close contact with each other so as to connect light-exiting surfaces of said second bundle of lens elements to each other, wherein said illumination light emitted from said rays-bundle shaping optical system is converged by said first bundle and diverged by said second bundle of lens elements so as to form a surface light source; and
a condenser optical system which superposes said illumination light diverging from said surface light source formed by said fly-eye lens so as to make said illumination light irradiate the pattern of said reticle,
wherein each of said lens elements in said first bundle has a biconvex shape with an entering side lens surface with a radius of curvature $r_1$, and an exiting side lens surface with a radius of curvature $r_2$, and
wherein each of said lens elements in said first bundle and said second bundle has a focal length f and, when said illumination light enters said lens elements of said front group in parallel to an optical axis of said lens elements in said first bundle with a maximum incident height $h_{max}$ and then is emitted therefrom with an exit angle $\theta_{max}$, where following conditions are substantially satisfied:

$h_{max} = f \cdot \sin \theta_{max}$, $|r_1| < |r_2|$.

17. An exposure apparatus according to claim 16, wherein said condenser optical system has a focal length F and, concerning said illumination light which is incident with said angle $\theta_{max}$ with respect to its optical axis coinciding with that of said fly-eye lens and then forms an image, with an image height $y_{max}$, on said surface to be irradiated, substantially satisfies a conditional expression:

$y_{max} = F \cdot \sin \theta_{max}$.

18. A fly-eye lens according to claim 16, wherein, with respect to said focal length f, maximum incident angle $h_{max}$ and exit angle $\theta_{max}$, each of said lens elements in said first bundle and in said second bundle satisfies a conditional expression:

$|h_{max}/(f \cdot \sin \theta_{max}) - 1| < 0.01$.

19. A fly-eye lens according to claim 16, wherein each of said lens elements in said first bundle and in said second bundle is composed of a plurality of minute lenses which are arranged so as to share their optical axis while having their front-side and rear-side focal points respectively positioned on the light-entering and light-exit surfaces of each of said lens elements in said first bundle and in said second bundle.

20. A fly-eye lens according to claim 19, wherein said plurality of minute lenses corresponding to each other among said lens elements in said first bundle and in said second bundle are arranged in two-dimensionally close contact with each other so as to form a plurality of lens bundles each connecting light-entering and light-exit surfaces of said plurality of minute lenses to each other.

21. A fly-eye lens according to claim 19, wherein said plurality of minute lenses in each of said lens elements in said first bundle and in said second bundle are composed of a first minute lens disposed on the light-entering side of said corresponding lens element in said first bundle and in said second bundle and a second minute lens disposed on the light-exit side of said corresponding lens element in said first bundle and in said second bundle, wherein a plurality of lens elements are constituted by two groups of two sheets, said first minute lens being a biconvex lens which has a first refractive surface with a radius of curvature $r_1$ on the light-entering surface side of said corresponding lens element in said first bundle and in said second bundle, and a second refractive surface with a radius of curvature $r_2$ on the light-exit surface side of said corresponding lens element in said first bundle and in said second bundle, satisfying a conditional expression:

$|r_1| < |r_2|$.

22. A fly-eye lens according to claim 21, wherein said second minute lens is a plano-convex lens with a planar surface positioned on the light-entering surface of said corresponding lens element in said first bundle and in said second bundle and, with respect to said radii of curvature $r_1$ and $r_2$, said first minute lens satisfies a conditional expression:

$|r_2| = 6|r_1|$.

23. A fly-eye lens according to claim 1, wherein said lens elements in said first bundle have a same shape as said lens elements in said second bundle.

24. A fly-eye lens according to claim 1, wherein each of said lens elements in said second bundle has a biconvex shape with an entering side surface having a radius of curvature $r_3$, and exiting side lens surface having a radius of curvature $r_4$, and wherein following conditions are satisfied:

$|r_1| = |r_4|$, $|r_2| = |r_3|$.

* * * * *